United States Patent
Adachi

(10) Patent No.: US 9,666,196 B2
(45) Date of Patent: May 30, 2017

(54) RECORDING APPARATUS WITH MASTERING FUNCTION

(71) Applicant: TEAC Corporation, Tama-shi, Tokyo (JP)

(72) Inventor: Shigeyuki Adachi, Tachikawa (JP)

(73) Assignee: TEAC CORPORATION, Tokyo (JP)

(*) Notice: Subject to any disclaimer, the term of this patent is extended or adjusted under 35 U.S.C. 154(b) by 393 days.

(21) Appl. No.: 13/748,439

(22) Filed: Jan. 23, 2013

(65) Prior Publication Data

US 2014/0098961 A1    Apr. 10, 2014

(30) Foreign Application Priority Data

Oct. 10, 2012 (JP) ................. 2012-225515

(51) Int. Cl.
*H04R 5/00* (2006.01)
*G10L 19/008* (2013.01)
(Continued)

(52) U.S. Cl.
CPC ...... *G10L 19/008* (2013.01); *G11B 20/00007* (2013.01); *G11B 20/10527* (2013.01);
(Continued)

(58) Field of Classification Search
CPC .... H04R 25/407; H04R 25/356; H04R 25/50; H04R 25/505; H03G 3/20; H03G 11/00; H03G 7/00; H03G 3/00; H03G 7/007; G10H 1/0025; G10K 1/00; G11B 20/10527; G11B 20/00007; G11B 2020/00014; G11B 2020/10574
(Continued)

(56) References Cited

U.S. PATENT DOCUMENTS

| 4,080,528 A | 3/1978 | Kao et al. |
| 4,442,456 A * | 4/1984 | Iwata ............... H01L 27/14618 250/208.1 |

(Continued)

FOREIGN PATENT DOCUMENTS

| CN | 101641965 A | 2/2010 |
| CN | 102246544 A | 11/2011 |

(Continued)

OTHER PUBLICATIONS https://web.archive.org/web/20111020061218/http://en.wikipedia.org/wiki/Audio_normalization.*

(Continued)

*Primary Examiner* — Vivian Chin
*Assistant Examiner* — Ammar Hamid
(74) *Attorney, Agent, or Firm* — Seed Intellectual Property Law Group LLP

(57) ABSTRACT

There is provided a recording apparatus which can effectively execute compression processing regardless of the mixdown level, and which can thereby carry out the mastering process easily. A DSP mixes down audio signals assigned to a plurality of tracks into a stereo audio signal. When performing the mastering process, the DSP normalizes the stereo audio signal before performing the compression processing, subsequently carries out the compression processing, then performs normalization again so as to produce master data, and records the master data in a recorder.

7 Claims, 4 Drawing Sheets

(51) Int. Cl.
- *G11B 20/10* (2006.01)
- *H03G 7/00* (2006.01)
- *G11B 20/00* (2006.01)
- *H03G 3/00* (2006.01)

(52) U.S. Cl.
CPC ... *H03G 7/007* (2013.01); *G11B 2020/00014* (2013.01); *G11B 2020/10574* (2013.01)

(58) Field of Classification Search
USPC ...... 381/17, 57, 58, 104, 107, 109, 120, 119
See application file for complete search history.

(56) References Cited

U.S. PATENT DOCUMENTS

| | | | |
|---|---|---|---|
| 4,442,546 A * | 4/1984 | Ishigaki | H03G 9/025 381/106 |
| 5,508,855 A | 4/1996 | Hutchins et al. | |
| 5,956,196 A | 9/1999 | Hull et al. | |
| 6,925,340 B1 | 8/2005 | Suito et al. | |
| 7,813,931 B2 | 10/2010 | Hetherington et al. | |
| 8,352,052 B1 | 1/2013 | Green et al. | |
| 8,787,595 B2 | 7/2014 | Urata | |
| 8,867,750 B2 | 10/2014 | Brown | |
| 2002/0057808 A1 | 5/2002 | Goldstein | |
| 2004/0213420 A1 | 10/2004 | Gundry et al. | |
| 2009/0074209 A1* | 3/2009 | Thompson | H03G 9/005 381/107 |
| 2010/0070283 A1 | 3/2010 | Kato et al. | |
| 2010/0086149 A1 | 4/2010 | Kuroda et al. | |
| 2010/0254546 A1 | 10/2010 | Hosomi | |
| 2011/0054648 A1 | 3/2011 | Maxwell et al. | |
| 2011/0129091 A1 | 6/2011 | Kron | |
| 2011/0243338 A1 | 10/2011 | Brown | |
| 2011/0255712 A1 | 10/2011 | Urata | |
| 2012/0093343 A1 | 4/2012 | Batchelder et al. | |
| 2012/0114127 A1 | 5/2012 | Yamashita et al. | |
| 2012/0191462 A1* | 7/2012 | Aoki | H03G 7/002 704/500 |
| 2012/0213375 A1 | 8/2012 | Mahabub et al. | |
| 2013/0054251 A1* | 2/2013 | Eppolito | H03G 7/007 704/500 |
| 2014/0039891 A1* | 2/2014 | Sodeifi | G10L 21/0272 704/246 |

FOREIGN PATENT DOCUMENTS

| | | |
|---|---|---|
| CN | 102257728 A | 11/2011 |
| CN | 102610229 A | 7/2012 |
| JP | 08-055428 A | 2/1996 |
| JP | 2009-031357 A | 2/2009 |
| JP | 2011-217066 A | 10/2011 |
| JP | 2011530843 A | 12/2011 |
| JP | 2012-104992 A | 5/2012 |
| WO | 2010015275 A1 | 2/2010 |

OTHER PUBLICATIONS

Chinese Office Action dated Mar. 9, 2015, for CN Application No. 201310467149.6, 7 pages.

Final Office Action dated May 7, 2015, for corresponding U.S. Appl. No. 13/748,414, 14 pages.

Chinese Office Action dated Mar. 9, 2015, for corresponding CN Application No. 201310468494.1, 7 pages.

Japanese Notice of Grounds for Rejection for Corresponding JP Application No. 2012-225515 issued May 10, 2016, 7 pages (including partial English translation).

* cited by examiner

RECORDING APPARATUS WITH MASTERING FUNCTION

PRIORITY INFORMATION

This application claims priority to Japanese Patent Application No. 2012-225515, filed on Oct. 10, 2012, which is incorporated herein by reference in its entirety.

TECHNICAL FIELD

The present invention relates to a recording apparatus such as a multi-track recorder which records audio signals on a plurality of tracks.

BACKGROUND ART

A multi-track recorder for recording audio signals on a plurality of tracks is conventionally known. By means of a multi-track recorder, it is possible to record, for example, a rhythm guitar part on track 1 and a lead guitar part on track 2 using electric guitars, and to further record a vocal part on track 3 using an integrated microphone, and then mix down these parts to generate and record a stereo signal.

JP 2011-530843 A includes disclosure concerning an automatic mastering function of a multi-channel sound system. JP 2011-530843 A describes adjusting channel faders to a uniform value, limiting at least two channels to a uniform output level, limiting each of the other channels to a decibel output level value lower than the uniform output level value of the two channels, and further adjusting a parameter value of at least one of the channel fader, threshold, release, and output level, to thereby carry out further compression and/or limiting of the encoded channels.

In a multi-track recorder, mixdown is normally performed at as high a level as possible without generating distortion, and subsequently a mastering process is performed to complete recording. The mastering process includes executing sound quality correction (equalizer processing), processing for increasing sound pressure (compression processing), and processing for adjusting to a designated level (normalization). Without a certain degree of knowledge and experience, it is difficult for one to obtain desired results from the mastering process. In particular, in the compression processing for increasing sound pressure, threshold and ratio adjustments are relatively difficult. For this reason, there has been proposed a configuration in which several presets are provided for each type of music and a user selects a desired preset from among these presets. However, such a configuration is disadvantageous in that presets may not be effective when the mixdown is not carried out at an appropriate recording level.

FIGS. 5A and 5B schematically show compression processing in the mastering process. FIG. 5A illustrates compression (compressor) processing performed when the mixdown is carried out at an appropriate level. In the figures, 0 dBFS is the target level that serves as a reference, and TH is the threshold value for the compression processing. Compression processing is processing in which parts of a signal having a level exceeding the threshold value are compressed by a predetermined ratio while other parts of the signal having a level at or below the threshold value are maintained. Accordingly, when the mixdown is carried out at an appropriate level and the level reaches the threshold value TH as shown in FIG. 5A, the compression processing is meaningful.

On the other hand, FIG. 5B illustrates compression processing performed when the mixdown is carried out at an inappropriate level that is too low. Although decreasing of the mixdown level can be effective in consideration of preventing distortion due to an overly high level, when the level is too low, the level does not reach the threshold value TH such that compression is not executed at all, rendering the compression processing meaningless. This situation can occur similarly when presets are provided. When the mixdown level is lower than the threshold value TH of a selected preset, the compression processing does not function substantially.

SUMMARY

The present invention provides a recording apparatus which can effectively execute compression processing regardless of the level of the audio signal, such as a stereo audio signal obtained by mixing down, and which can thereby carry out the mastering process easily.

The present invention provides a recording apparatus for recording an audio signal, comprising a pre-normalize unit for amplifying a level of an audio signal to a target reference level, and a compression unit for compressing, from among levels of the audio signal that has been processed by the pre-normalize unit, a level that exceeds a predetermined threshold value.

According to one embodiment of the present invention, the recording apparatus further comprises a mixdown unit for producing a stereo audio signal from audio signals assigned to respective ones of a plurality of tracks, and the pre-normalize unit amplifies a level of the stereo audio signal to the reference level.

According to another embodiment of the present invention, the recording apparatus further comprises a filter unit for removing signals in a predetermined frequency band from the stereo signal produced in the mixdown unit. Further, the pre-normalize unit detects a peak level of the stereo signal from which signals in the predetermined frequency band are removed, and amplifies the detected peak level to the reference level. For example, the filter unit removes signals at or below 20 Hz and signals at or above 12 kHz from the stereo signal produced in the mixdown unit.

According to a further embodiment of the present invention, the recording apparatus further comprises a post-normalize unit for amplifying a level of the audio signal that has been processed by the compression unit to the reference level.

According to a still further embodiment of the present invention, the compression unit compresses, from among the levels of the audio signal that has been processed by the pre-normalize unit, the level that exceeds the predetermined threshold value, and simultaneously amplifies a level of the audio signal to the reference level.

According to another embodiment of the present invention, assuming that r denotes a predetermined compression ratio and β denotes an amplification ratio for causing an audio signal peak level, which should be obtained when the audio signal is compressed by the predetermined compression ratio r, to match the reference level, the compression unit compresses, from among the levels of the audio signal that has been processed in the pre-normalize unit, the level that exceeds the predetermined threshold value by a ratio β·r, and compresses a level at or below the threshold value by the ratio β.

According to the present invention, compression processing can be executed effectively regardless of the audio signal level, and therefore a mastering process can be carried out easily. According to the present invention, even when the audio signal level is low, compression processing can be executed reliably, so that the user can be well aware of the effectiveness of the mastering process.

BRIEF DESCRIPTION OF THE DRAWINGS

Preferred embodiments of the present invention will be described in detail based on the following figures, wherein.

DESCRIPTION OF EMBODIMENTS

In the following, an embodiment of the present invention is described by reference to the drawings and by referring to a multi-track recorder as an example of a recording apparatus.

Figure 1:
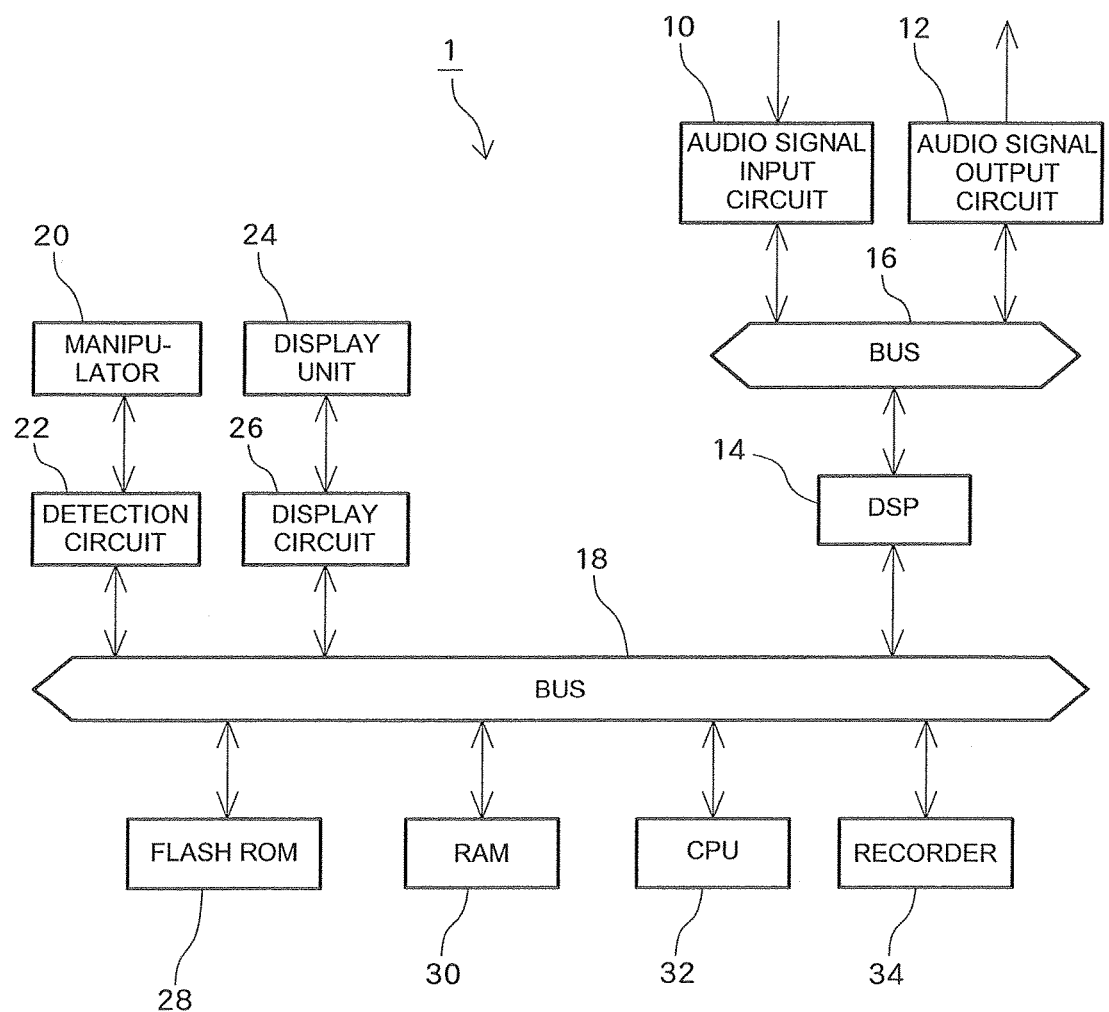
FIG. 1 is a configuration diagram showing a multi-track recorder according to an embodiment of the present invention.

FIG. 1 is a configuration block diagram showing a multi-track recorder 1 according to the present embodiment. An audio signal input circuit 10 has a plurality of input ports, and receives input of audio signals from a plurality of sound sources. Examples of the audio signals include those of a guitar, vocal, and drums. The audio signal input circuit 10 includes an integrated microphone and/or the input ports for receiving input of the audio signals. When both of the integrated microphone and the input ports are provided, the integrated microphone and the input ports are mutually switchable. An audio signal input from the audio signal input circuit 10 is transmitted to a DSP (digital signal processor) 14 via a bus 16.

Under control of a CPU 32, the DSP 14 carries out predetermined digital processing with respect to the audio signals of a plurality of channels supplied from the audio signal input circuit 10. Specifically, the DSP 14 executes a mixdown process, a mastering process, and the like with respect to those signals, and then records the resulting signals in a recorder 34 via a bus 18. A recording medium used in the recorder 34 may be an optical disc such as a CD-R/RW or a DVD-R/RW, a hard disk, a flash memory medium, and the like. The processing performed by the DSP 14 also includes adjustment of pan and volume of each audio signal in response to manipulations of a manipulator 20.

The manipulator 20 is provided on a console surface of the multi-track recorder 1. The manipulator 20 comprises various key switches, selection button, menu button, OK button, pan adjustment knobs, level adjustment knobs, and the like. By manipulating the manipulator 20, a user assigns each audio signal to at least one track among the plurality of tracks. The manipulation state of the manipulator 20 is detected by a detection circuit 22. The detection circuit 22 supplies a manipulation state detection signal representing the manipulation state of the manipulator 20 to the CPU 32 via the bus 18.

The CPU 32 performs centralized control of the overall multi-track recorder. The CPU 32 executes various processes by following programs stored in a flash ROM 28 and using a RAM 30 as a working memory. Specifically, based on a manipulation state detection signal supplied from the detection circuit 22, the CPU 32 assigns each of the audio signals of the plurality of channels to at least one of the plurality of tracks. For example, when there are provided tracks 1 to 8, channel A may be assigned to track 1, channel B may be assigned to track 2, and channel C may be assigned to track 8. Further, the CPU 32 supplies various information to a display circuit 26. The display circuit 26 displays the various information on a display unit 24.

The CPU 32 provides commands to the display circuit 26 for causing display of various menu screens and settings screens in response to manipulations of the manipulator 20 by a user. In accordance with information from the CPU 32, the display circuit 26 displays menu screens and settings screens on the display unit 24.

Further, the CPU 32 provides commands to the display circuit 26 for causing display of the levels of the audio signals assigned to the respective tracks in a format such as a bar graph format (i.e., a level meter). In accordance with information from the CPU 32, the display circuit 26 displays a level meter image on the display unit 24.

Furthermore, in accordance with a manipulation state detection signal supplied from the detection circuit 22, the CPU 32 reads out an audio signal recorded in the recorder 34 and supplies this audio signal to the DSP 14, and the DSP 14 outputs the audio signal to outside via the bus and an audio signal output circuit 12. The audio signal output circuit 12 has various output ports such as analog output ports, digital output ports, and the like.

Since the DSP 14 of the present embodiment performs a mixdown process and a mastering process as described above, the DSP 14 functions as a mixdown processor and a mastering processor. These processes are performed by sequentially reading out a program stored in advance in a program memory and by having the DSP 14 execute the program successively. Instead of the DSP 14, it is of course alternatively possible to provide hardware for performing a mixdown process and hardware for performing a mastering process. In other words, the mixdown process and the mastering process may be executed by means of either hardware or software.

A mixdown process is a process of synthesizing the audio signals of a plurality of channels supplied from the audio signal input circuit 10 into L-channel and R-channel audio signals. The mixdown process is carried out while manipulating the level adjustment knob for each track so as to adjust the levels and the balance, and also while adjusting the overall level. Further, using the pan adjustment knob for each track, each track is localized in stereo in the L- and R-channels. The levels of the L- and R-channels (i.e., stereo meter) are displayed on the display unit 24, and the user adjusts the levels by visually checking the displayed levels.

Figure 2:
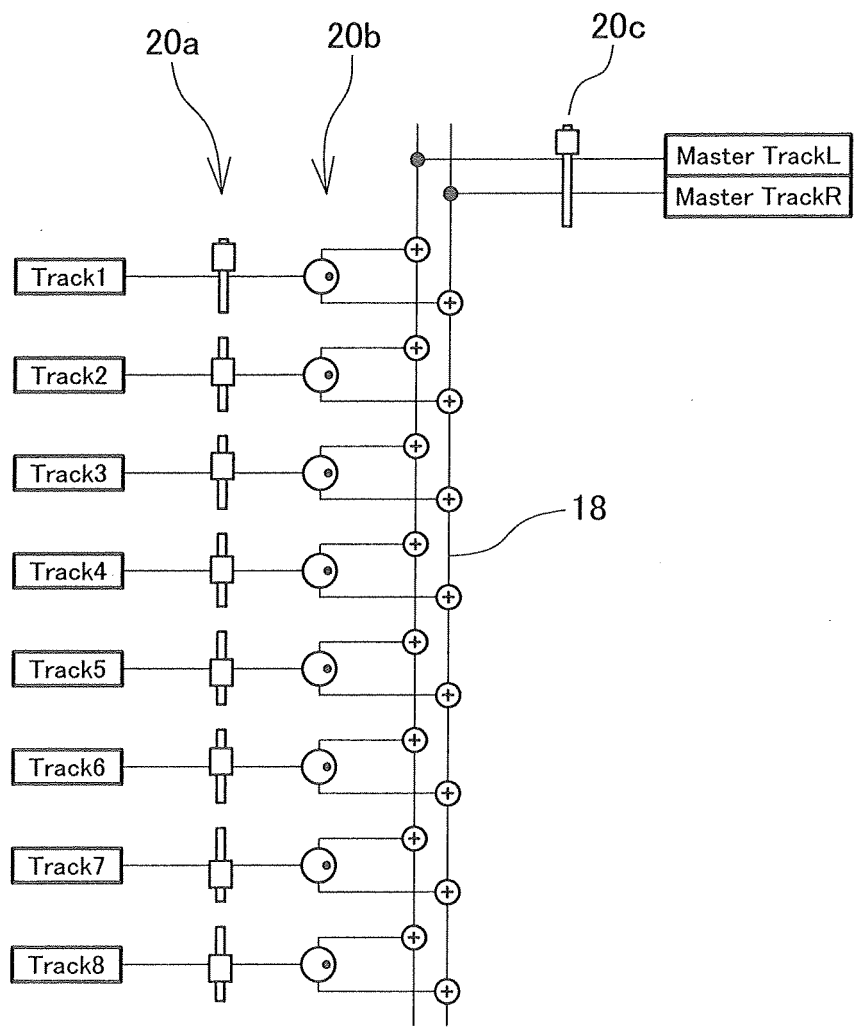
FIG. 2 is a functional block diagram illustrating a mixdown process.

FIG. 2 shows a functional block diagram illustrating a mixdown process. Eight tracks from track 1 to track 8 are each assigned an audio signal. Recording for each track is executed at a level as close to the full scale (0 dB) as possible. The level of the audio signal of each track is adjusted by means of a channel fader 20a provided for each channel. Further, using the pan adjustment knob 20b, the L (left) and R (right) levels of each audio signal are adjusted so as to localize the audio signal. The master fader 20c is set to 0 dB, and the audio signals are mixed down into the master track (stereo track) while the overall level is adjusted. Specifically, the user visually checks the stereo meter and carries out the mixdown process at a level as close to the full scale as possible without exceeding the reference level.

A mastering process includes equalizer processing (equalization), compression processing, and normalization processing. The mastering process is started when the user sets a starting point and an ending point of an audio signal that should be mastered, and manipulates a "master recording" button or selects a "master recording" menu. A plurality of sets of threshold value and ratio (i.e., a plurality of presets) for the compression processing in the mastering process are provided in advance, so that the user can select a desired preset. However, when the audio signal resulting from the mixdown process has an inappropriate level that is too low, the audio signal level is lower than the threshold value of the compression processing, such that no meaningful effect can be achieved by the compression processing.

As such, according to the present embodiment, in a mastering process, normalization of the audio signal is executed before the compression processing so as to adjust the audio signal level, and subsequently the compression processing is performed. According to the present embodiment, normalization executed before the compression processing is referred to as "pre-normalization".

Figure 3:
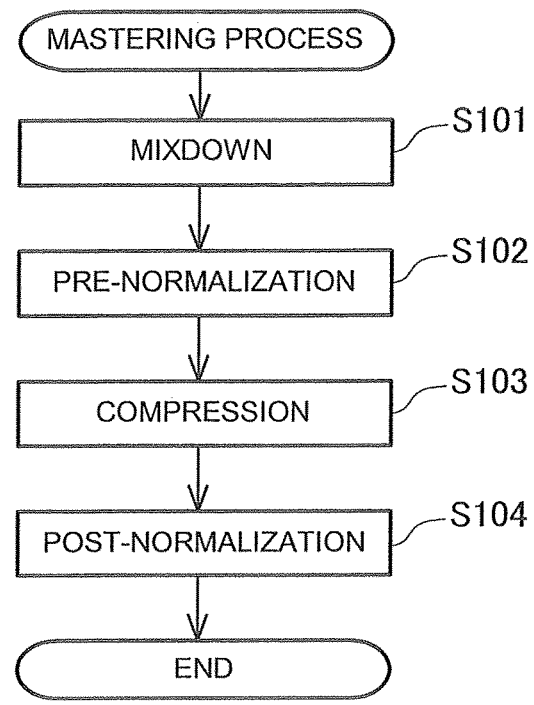
FIG. 3 is a flowchart illustrating a mastering process according to an embodiment of the present invention.

FIG. 3 is a flowchart illustrating the mastering process, which is carried out by the DSP 14. First, in response to an instruction from the user, a mixdown process is performed to synthesize the audio signals of a plurality of channels supplied from the audio signal input circuit 10 into L- and R-channel audio signals (S101). The L- and R-channel stereo audio signals resulting from the mixdown process are stored in the RAM 30 or the recorder 34.

Next, when the user instructs "master recording", the DSP 14 executes pre-normalization (S102). Specifically, the stereo audio signals stored in the RAM 30 or the recorder 34 are read out, and are adjusted by being amplified overall until the peak value of the stereo audio signals reaches a target level (for example, 0 dBFS) that serves as a reference.

Figure 4A:
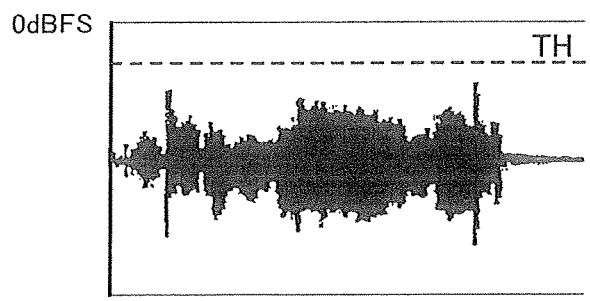
FIG. 4A is a diagram explaining levels obtained after mixdown according to an embodiment of the present invention.
Figure 4B:
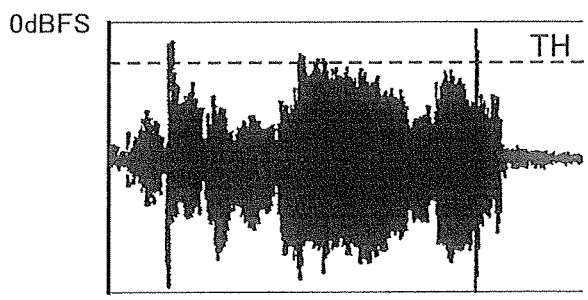
FIG. 4B is a diagram explaining levels obtained after pre-normalization according to an embodiment of the present invention.
Figure 5A:
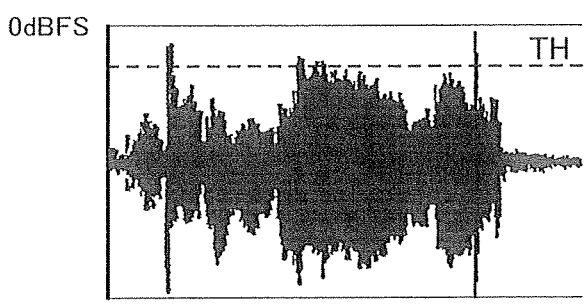
FIG. 5A is a diagram explaining compression processing when mixdown is performed at an appropriate level.
Figure 5B:
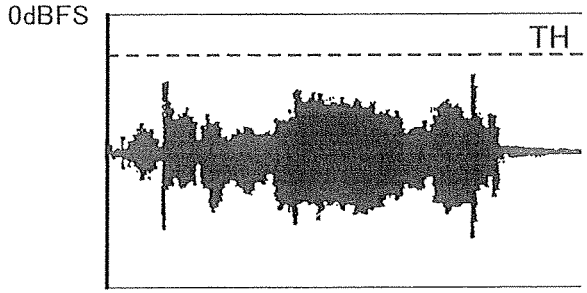
FIG. 5B is a diagram explaining compression processing when mixdown is not performed at an appropriate level.

FIGS. 4A and 4B illustrate the manner in which the pre-normalization processing is performed. FIG. 4A shows the level of the audio signal resulting from the mixdown process. In the figures, TH denotes the threshold value for the compression processing carried out subsequently. This TH may be a preset value (fixed value) or a value set arbitrarily by the user. In the case of FIG. 4A, since the level of the mixed-down audio signal is too low and does not reach the threshold value TH, compression would not be executed substantially, so that the compression processing would be meaningless.

In contrast, FIG. 4B shows the level of the audio signal obtained as a result of the pre-normalization processing. The audio signal is amplified so that the peak of the audio signal level reaches full scale (0 dBFS in the figures). Accordingly, the audio signal level reaches the threshold value TH, and therefore compression would be executed substantially. It can be said that the pre-normalization achieves effects similar to those attained when the mixdown process is performed at an appropriate level.

After performing the pre-normalization, equalizer processing (equalization) is performed as necessary, and then the compression processing is carried out (S103). In other words, from among parts of the audio signal, the parts having levels exceeding the threshold value are compressed at a predetermined ratio so that the sound pressure of the audio signal becomes enhanced. The threshold value and ratio in the present embodiment are the threshold value and ratio of a preset selected by the user. For example, the ratio is 10:1. As a result of the compression processing, although the parts of the audio signal having levels exceeding the threshold value are compressed and made relatively smaller, the waveform of the original audio signal remains.

Subsequently, with respect to the audio signal obtained after the compression processing, normalization is performed again (S104). Since this normalization is performed after the compression processing, this normalization is referred to as "post-normalization" in order to distinguish from the normalization performed before the compression. According to the post-normalization processing, the compressed audio signal is amplified so that its peak value again corresponds to the target reference level (for example, 0 dBFS).

The audio signal after being processed as described above is recorded in the recorder 34 as master data. The master data is read out in response to a reproduction instruction by the user and output from the audio signal output circuit 12. The master data may be converted into WAV format or the like and output to an external personal computer.

According to the present embodiment, by carrying out the pre-normalization before the compression processing, the level of the mixed-down audio signal is adjusted to an appropriate level. As such, even when the level of the mixed-down audio signal is too low, the compression processing can be executed effectively and the sound pressure of the audio signal can be enhanced.

In the present embodiment, before carrying out the pre-normalization, it is necessary to detect the peak value of the stereo audio signal obtained as a result of the mixdown process. As well as simply detecting the peak of the stereo signal, it is also possible to first remove frequency bands unnecessary for the peak detection from the stereo audio signal by means of a filter such as a band-pass filter, and then detect the peak. For example, the frequency bands unnecessary for the peak detection are frequencies at or below 20 Hz and those at or above 12 kHz (these frequency bands are set arbitrarily depending on the configuration and characteristics of the apparatus to which the invention is applied). It is further possible to detect the envelope of the stereo audio signal and detect the peak of the envelope.

Since the present embodiment includes two normalization processes which are the pre-normalization of S102 and the post-normalization of S104, time required for completing the mastering process could become relatively longer.

If the time for the mastering process should be reduced, the compression processing of S103 and the post-normalization processing of S104 in FIG. 3 may be executed simultaneously, and it is thereby possible to avoid providing a separate step of post-normalization of S104.

Figure 6:
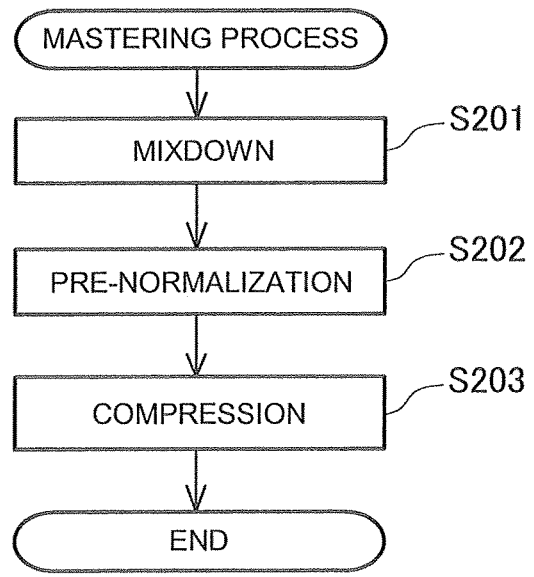
FIG. 6 is a flowchart illustrating a mastering process according to another embodiment of the present invention.

FIG. 6 is a flowchart illustrating a process according to another embodiment, which is executed by the DSP 14. First, in response to an instruction from the user, a mixdown process is performed to synthesize the audio signals of a plurality of channels supplied from the audio signal input circuit 10 into L- and R-channel audio signals (S201). The L- and R-channel stereo audio signals resulting from the mixdown process are stored in the RAM 30 or the recorder 34.

Next, when the user instructs "master recording", the DSP 14 executes pre-normalization (S202). Specifically, the stereo audio signals stored in the RAM 30 or the recorder 34 are read out, and are adjusted by being amplified overall until the peak value of the stereo audio signals reaches a target level (for example, 0 dBFS) that serves as a reference.

After performing the pre-normalization, an equalizer processing (equalizing) is performed as necessary, and then the compression processing is carried out (S203). In other words, from among parts of the audio signal, the parts having levels exceeding the threshold value are compressed by a predetermined ratio so that the sound pressure of the audio signal becomes enhanced. The threshold value and ratio are the threshold value and ratio of a preset selected by the user.

Here, when executing the compression processing, an output level obtained after the compression processing is predicted by calculation, and the audio signal is compressed and amplified so that the peak value of the predicted level corresponds to the target reference level (0 dBFS). More specifically, from among parts of the stereo audio signal obtained by mixing down, since the parts having levels exceeding the threshold value TH are to be compressed by a predetermined ratio (denoted as "r"), the level of the audio signal that should be obtained if the audio signal is compressed by the predetermined ratio is calculated, and the peak value of the calculated level is determined. Then, an amplification ratio β for adjusting the calculated peak value to the target reference level is calculated. Subsequently, among the parts of the stereo audio signal obtained by mixing down, the parts below the threshold value are amplified by the ratio β, and the parts exceeding the threshold value TH are compressed and amplified by the ratio β·r. To state it differently, the parts below the threshold value are compressed by the ratio β, and the parts exceeding the threshold value TH are compressed by the ratio β·r.

In this way, by simultaneously executing normalization when performing the compression processing, it is possible to eliminate the need to perform normalization again after completing the compression processing, so that the time required for the mastering process can be reduced.

While a multi-track recorder is referred to as an example for explaining the embodiments of the present invention, the present invention is not limited to this apparatus. The present invention can be applied to an arbitrary recording apparatus that performs compression processing on an audio signal and records the compressed signal on a recording medium.

The invention claimed is:

1. A recording apparatus for recording an audio signal, comprising:
   a controller;
   a memory configured to store instructions that are executed by the controller; and
   a signal processing section coupled to the controller and configured to execute under control of the controller, processing comprising:
   amplifying an audio signal to produce a pre-normalized audio signal having a plurality of levels, a peak level of the pre-normalized audio signal being equal to a target reference level that is independent of the audio signal;
   compressing one or more of the levels of the pre-normalized audio signal that exceed a predetermined threshold value to produce a compressed audio signal; and
   amplifying one or more levels of the compressed audio signal to the reference level.

2. A recording apparatus for recording an audio signal, comprising:
   a controller;
   a memory configured to store instructions that are executed by the controller; and
   a signal processing section coupled to the controller and configured to execute under control of the controller, processing comprising:
   amplifying an audio signal to produce a pre-normalized audio signal having a plurality of levels, a peak level of the pre-normalized audio signal being equal to a target reference level that is independent of the audio signal; and
   compressing one or more of the levels of the pre-normalized audio signal that exceed a predetermined threshold value to produce a compressed audio signal, and simultaneously amplifying one or more levels of the compressed audio signal to the reference level.

3. The recording apparatus according to claim 1, wherein the signal processing section:
   produces a stereo audio signal from audio signals assigned to respective ones of a plurality of tracks, and
   amplifies a peak level of the stereo audio signal to the reference level.

4. The recording apparatus according to claim 3, wherein the signal processing section further comprises:
   a filter section configured to remove signals in a predetermined frequency band from the stereo signal, and detect a peak level of the stereo signal from which signals in the predetermined frequency band have been removed, and amplifies the detected peak level to the reference level.

5. The recording apparatus according to claim 4, wherein the filter section removes signals at or below 20 Hz and signals at or above 12 kHz from the stereo signal.

6. The recording apparatus according to claim 2, wherein assuming that r denotes a predetermined compression ratio and β denotes an amplification ratio for causing an audio signal peak level, obtained when the pre-normalized audio signal is compressed by the predetermined compression ratio r, to match the reference level, the signal processing section compresses one or more levels of the pre-normalized audio signal that exceed the predetermined threshold value by a ratio β·r, and compresses one or more levels of the pre-normalized audio signal at or below the threshold value by the ratio β.

7. The recording apparatus according to claim 2, wherein the signal processing section compresses one or more levels of the pre-normalized audio signal that exceed the predetermined threshold value by a first ratio, and compresses one or more levels of the pre-normalized audio signal at or below the threshold value by a second ratio that is different from the first ratio.

* * * * *